United States Patent
Morita et al.

(10) Patent No.: US 8,432,110 B2
(45) Date of Patent: Apr. 30, 2013

(54) LASER LIGHT SOURCE DEVICE

(75) Inventors: Shoji Morita, Tokyo (JP); Takayuki Yanagisawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 258 days.

(21) Appl. No.: 13/090,897

(22) Filed: Apr. 20, 2011

(65) Prior Publication Data

US 2011/0260623 A1  Oct. 27, 2011

(30) Foreign Application Priority Data

Apr. 21, 2010 (JP) .................... 2010-098095

(51) Int. Cl.
*H01S 3/00* (2006.01)
*H01S 3/04* (2006.01)

(52) U.S. Cl.
USPC .................... 315/309; 372/34; 372/38.02

(58) Field of Classification Search .............. 315/309; 372/28, 34, 38.02, 29.015, 38.07, 38.09
See application file for complete search history.

(56) References Cited

U.S. PATENT DOCUMENTS

| | | | | |
|---|---|---|---|---|
| 7,733,931 B2 * | 6/2010 | Kamijima | ................ | 372/34 |
| 7,869,476 B2 * | 1/2011 | Kamijima | ................ | 372/34 |
| 7,967,452 B2 * | 6/2011 | Itoh et al. | ................ | 353/99 |
| 2008/0165815 A1 * | 7/2008 | Kamijima | ................ | 372/34 |
| 2010/0208758 A1 * | 8/2010 | Kamijima | ................ | 372/34 |

FOREIGN PATENT DOCUMENTS

| JP | 8-101416 A | 4/1996 |
|---|---|---|
| JP | 2008-164900 A | 7/2008 |

* cited by examiner

*Primary Examiner* — Daniel D Chang
(74) *Attorney, Agent, or Firm* — Birch, Stewart, Kolasch & Birch, LLP

(57) ABSTRACT

The present invention includes a laser element, a laser-element temperature measuring unit that measures a temperature of a laser element, a harmonic generation element that converts the wavelength of a laser light output by the laser element, a harmonic-generation-element temperature measuring unit that measures a temperature of the harmonic generation element, a harmonic-generation-element temperature adjusting unit that adjusts the temperature of the harmonic generation element, a storage unit that stores therein a relationship between the temperature of the laser element and a target temperature of the harmonic generation element at which a power of the laser light output by the harmonic generation element reaches a maximum, and a controlling unit that controls the harmonic-generation-element temperature adjusting unit so that the temperature of the harmonic generation element is adjusted to the target temperature obtained from the temperature of the measured laser element in accordance with the relationship.

7 Claims, 4 Drawing Sheets

LASER LIGHT SOURCE DEVICE

BACKGROUND OF THE INVENTION

1. Field of the Invention

The present invention relates to a laser light source device, particularly to a technology of controlling the temperature of a laser light source device that uses a wavelength conversion element.

2. Description of the Related Art

Recently, a technology of using a laser light source as a light source device for a monitor and a projector has been suggested. In contrast to a UHP lamp that has been conventionally used as a light source, the spectrum (spectral characteristic) of the laser light source does not spread out and exhibits high color purity. The laser light source is therefore advantageous because it has a wide color gamut and a long life and glows immediately after it is turned on.

Examples of laser light sources include laser diodes (semiconductor lasers) and second-harmonic generation (SHG) lasers. Although a laser diode is less expensive than an SHG laser, laser diodes of some colors have not yet been turned to practical use for a monitor or the like that requires various colors (with three basic RGB colors). Furthermore, laser diodes of colors like green that recently become available are costly.

In reality, to supply laser light of a desired wavelength by using a readily available general-purpose laser light source, the wavelength of a fundamental laser such as an SHG laser should be converted for a laser light source of a color that is not in practical use or a color that is in practical use but is still expensive. It has been known, however, that the wavelength conversion efficiency of the SHG element tends to decrease due to the refractive-index distribution that varies in accordance with the change of temperature. To improve the efficiency of the laser light of a laser using the SHG element and ensure a constant amount of light, a technology of controlling the temperature of the SHG element has been developed (see, for example, Japanese Patent Application Laid-open No. 08-101416 and Japanese Patent Application Laid-open No. 2008-164900).

Among the conventional technologies, Japanese Patent Application Laid-open No. 08-101416, for example, suggests a technology with which control is performed to keep the SHG output power constant and thereby realize a reduced size and low power consumption by converting the output power in accordance with a temperature dependency table that shows the dependency of the SHG output power with respect to the change of the measured temperature of the laser element, and storing in advance the SHG output power with respect to the change of temperature.

Furthermore, Japanese Patent Application Laid-open No. 2008-164900 suggests a device that controls the temperature in real time based on the result of measuring the temperature of an SHG element and a controlling method thereof. When the laser light source is actually controlled by use of the conventional technologies, however, the temperature may vary more than expected, or it may not be sufficiently controlled if variations of the laser elements are too large.

According to the method of Japanese Patent Application Laid-open No. 08-101416, the output power is not always suitably controlled only with the temperature dependency table that is meant to correct the thermal property of the laser element because the SHG element also has its own thermal property. In addition, according to the method of Japanese Patent Application Laid-open No. 2008-164900, because the temperature is measured in the SHG element and its surrounding area, the optical output is not controlled to be constant with respect to the change of temperature of the LD chip that may occur in accordance with changes of the drive current or drive signal to the laser element, and thus it is difficult to perform control to make the optical output constant. For this reason, the efficiency cannot be maintained high because the optimal temperature of the laser element varies in accordance with the conditions of driving the laser element.

SUMMARY OF THE INVENTION

It is an object of the present invention to at least partially solve the problems in the conventional technology.

A laser light source device according to the present invention, includes a laser element; a laser element temperature measuring unit that measures a temperature of the laser element; a harmonic generation element that converts a wavelength of laser light output by the laser element; a harmonic generation element temperature measuring unit that measures a temperature of the harmonic generation element; a harmonic generation element temperature adjusting unit that adjusts the temperature of the harmonic generation element; a storage unit that stores therein a relationship between the temperature of the laser element and a target temperature of the harmonic generation element at which power of the laser light output by the harmonic generation element reaches a maximum; and a controlling unit that controls the harmonic generation element temperature adjusting unit so that the temperature of the harmonic generation element is brought to the target temperature obtained in accordance with the relationship from the temperature of the laser element measured by the laser element temperature measuring unit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a laser light source device according to the present invention are explained in detail below with reference to the attached drawings. The invention, however, should not be restricted by these embodiments.

First Embodiment

Figure 1:
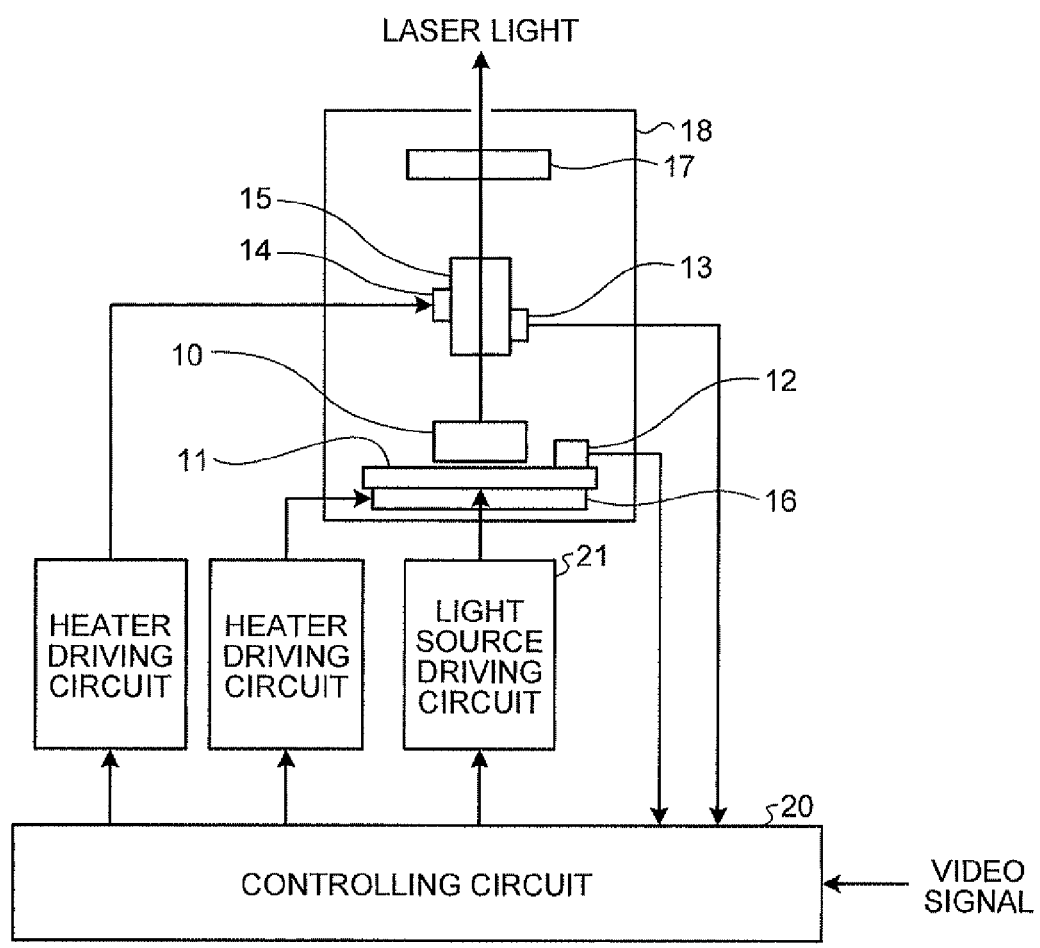
FIG. 1 is a diagram for showing the structure of a laser light source device incorporating an SHG element according to an embodiment of the present invention.

FIG. 1 is a diagram for showing the structure of a laser light source device 100 adopting a second-harmonic generation (SHG) element according to the first embodiment. The laser light source device 100 includes a laser element (excitation laser) 11, a laser element temperature measuring unit 12 such as a thermistor that measures the temperature of the laser element 11, a laser element heater 16 that adjusts the temperature of the laser element 11, a laser cell 10, an SHG element 15 (harmonic generation element) that converts wavelengths, an SHG element temperature measuring unit 13 (harmonic generation element temperature measuring unit) such as a thermistor that measures the temperature of the SHG element 15, and an SHG element heater 14 (harmonic generation element temperature adjusting unit) that adjusts the temperature of the SHG element 15, where laser light is emitted from the SHG element 15 and released by way of a resonant mirror 17 to the outside. The SHG element 15 is generally a nonlinear element, and thus it may be a harmonic generation element that outputs a higher harmonic than the second harmonic simultaneously with the second harmonic.

A controlling circuit 20 (controlling unit) supplies a drive signal and a drive current setting value to a light source driving circuit 21, and the light source driving circuit 21 generates a voltage desired for the laser element and achieves excitation of laser light. When a laser light source is used as a light source device of a monitor or a projector, signals are processed to obtain changes in video signal level and visual effects. In other words, when the drive current or ON/OFF of a drive enabling signal is controlled (i.e., duty change control is performed by controlling the pulse width modulation (PWM) of the drive signal), the temperatures of the laser element 11 and the SHG element 15 vary, which changes the conversion efficiency. As a result, the optical power changes.

According to the present embodiment, it is noted that the change in the temperature of the laser element 11 that occurs by controlling the drive current and ON/OFF of the drive enabling signal is associated with variations in the efficiency of the SHG element 15. Particularly, the relationship between the temperature of the laser element 11 and the high efficiency target temperature of the SHG element 15 is measured in advance, and the relational expression that finds the high efficiency target temperature of the SHG element 15 from the temperature of the laser element 11 is derived. Then, for example, the expression is stored in a storage medium provided in the controlling circuit 20 or the like. Based thereon, the SHG target temperature can be set to the most efficient value among the varying temperature conditions of the laser element.

Figure 2:
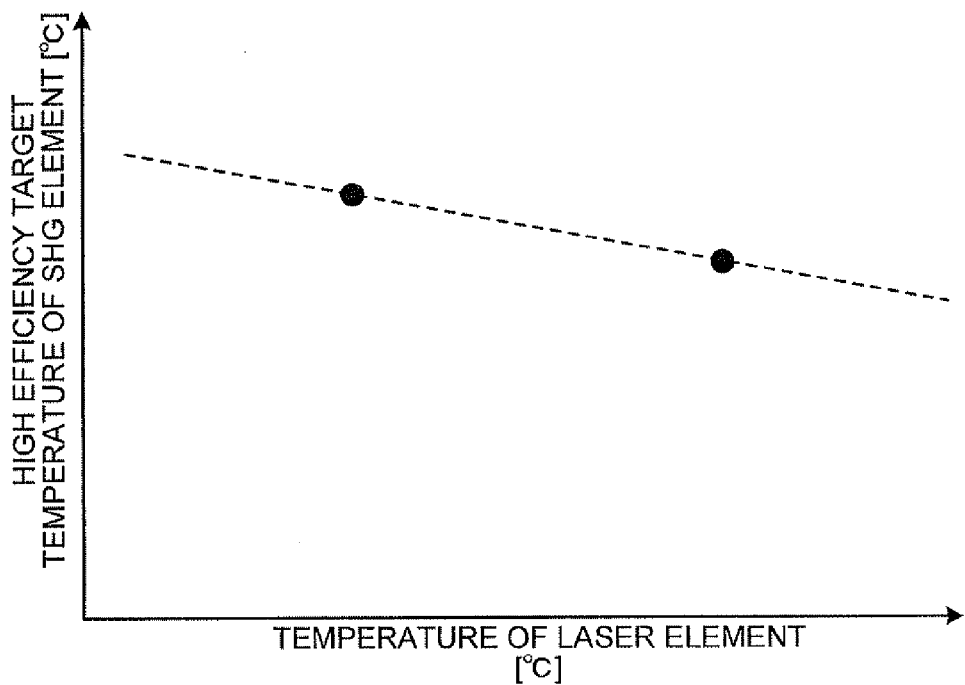
FIG. 2 is a diagram for showing a relationship between the temperature of a laser element and the high efficiency target temperature of the SHG element.

In FIG. 2, the relationship between the temperature of the laser element and the high efficiency target temperature of the SHG element is indicated. For example, in a green laser light source incorporating a laser element and an SHG element, the high efficiency target temperature of the SHG element tends to decrease as the temperature of the laser element increases. In such a situation, the temperature of the laser element and the temperature (high efficiency target temperature) at which the SHG element operates at optimum efficiency (i.e., the largest optical power is output) at the temperature of the laser element are measured at two points, one with a large drive current and the other with a small drive current. In this manner, the calculation expression for the relationship between the temperature of the laser element and the high efficiency target temperature of the SHG element can be derived.

Figure 3:
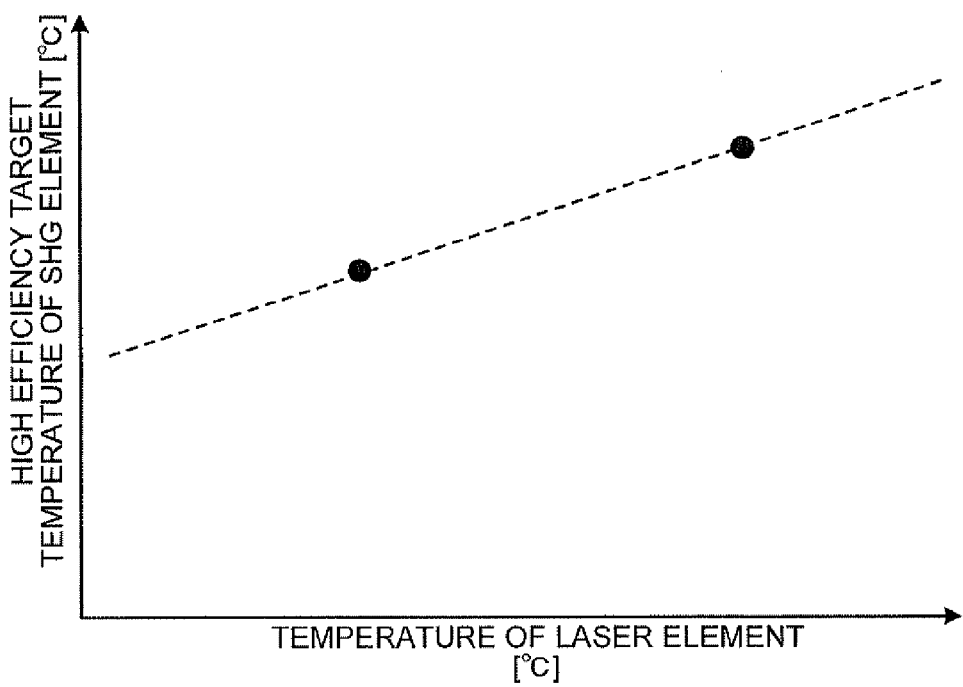
FIG. 3 is a diagram for showing another relationship between the temperature of the laser element and the high efficiency target temperature of the SHG element.

As mentioned above, the high efficiency target temperature of the SHG element tends to decrease, as the temperature of the laser element increases. Depending on variations in the production, however, the relationship may be reversed if the relationship (thermal conductivity) between the laser element and its thermistor (or temperature sensor) and between the SHG element and its thermistor (or temperature sensor) changes, as indicated in FIG. 3.

In such a situation, however, the calculation equation for the relationship between the temperature of the laser element and the high efficiency target temperature of the SHG element can still be derived by measuring the temperature of the laser element and the temperature at which the SHG element operates most efficiently (the high efficiency target temperature) at the temperature of the laser element at two points, one with a large drive current amount and the other with a small drive current amount, in a similar manner to the above.

As a specific method of measurement, the temperature of the laser element 11 and the corresponding high efficiency target temperature of the SHG element 15 are sought by measurement under two conditions, one with a large drive current amount (i.e., when the drive current to the laser element 11 is set large, or when the ratio of a pulse width to a cycle (H) is high in the duty cycle if PWM control is performed on the drive enabling signal (Enable) of the laser element 11: first condition), and the other with a small drive current amount (i.e., when the drive current to the laser element 11 is set small, or when the ratio of H is small in the duty cycle if the PWM control is performed on the drive enabling signal (Enable) of the laser element 11: second condition).

First, if the drive current amount is large, the temperature at which the SHG element 15 delivers a high wavelength conversion efficiency in a situation that the condition is satisfied is sought. Because the SHG element 15 is provided with the SHG element temperature measuring unit 13 and the SHG element heater 14 that serves as a means for adjusting the temperature of the SHG element 15, the SHG element 15 can be brought to a desired temperature.

While maintaining the above condition, the target temperature of the SHG element 15 is changed every few degrees Celsius, and the optical power is measured accordingly. The target temperature of the SHG element 15 with the largest optical power is the target temperature at which the SHG element 15 operates most efficiently, or in other words, the high efficiency target temperature. Furthermore, by measuring the temperature of the laser element 11 at such time, the temperatures of the laser element 11 and of the SHG element 15 at which the optimum optical output can be realized under the first condition of a large drive current amount can be found.

Next, if the drive current amount is small, the target temperature of the SHG element 15 is changed every few degrees Celsius in a situation that the condition is satisfied, and the optical power is measured accordingly. The target temperature of the SHG element 15 with the largest optical power is the target temperature at which the SHG element 15 operates most efficiently, or the high efficiency target temperature under this condition. Furthermore, by measuring the temperature of the laser element 11 at such time, the temperatures of the laser element 11 and the SHG element 15 at which the optimum optical output can be realized under the second condition of a small drive current amount can be found.

When the relationships between the temperatures of the laser element 11 and the SHG element 15 under the first and the second conditions are simply connected by line to form a graph, the relationship between the temperature of the laser element 11 and the high efficiency target temperature of the SHG element 15 at which the optimum optical output can be realized can be found as indicated in FIG. 2 (onto which linear correction is performed).

By obtaining the relationship indicated in FIG. 2, the target temperature (high efficiency target temperature) of the SHG element 15 can be obtained in correspondence with the temperature of the laser element 11 that changes in accordance with the variations of the drive current and the ON/OFF control of the drive enabling signal (changes in the duty cycle in accordance with the PWM control of the drive signal) by the signal processing for the visual effects.

Then, the controlling circuit 20 controls the SHG element heater 14 so that follow-up control can be realized to bring the temperature of the SHG element 15 to the target temperature. In this manner, the SHG element 15 is controlled at the optimum temperature in accordance with the changes of the temperature of the laser element 11, and thereby the laser light source system that realizes the optimum optical output can be achieved.

The equation for the relationship between the temperature of the laser element 11 and the high efficiency target temperature of the SHG element 15 obtained in advance by measurement as illustrated in FIG. 2 may be stored in a storage medium provided in the controlling circuit 20 or the like, as mentioned above. It does not matter, however, as long as the relational equation is stored in any storage medium whether it is provided inside or outside the laser light source device 100 so that the temperature of the SHG element 15 can be controlled in accordance with this equation.

Figure 5:
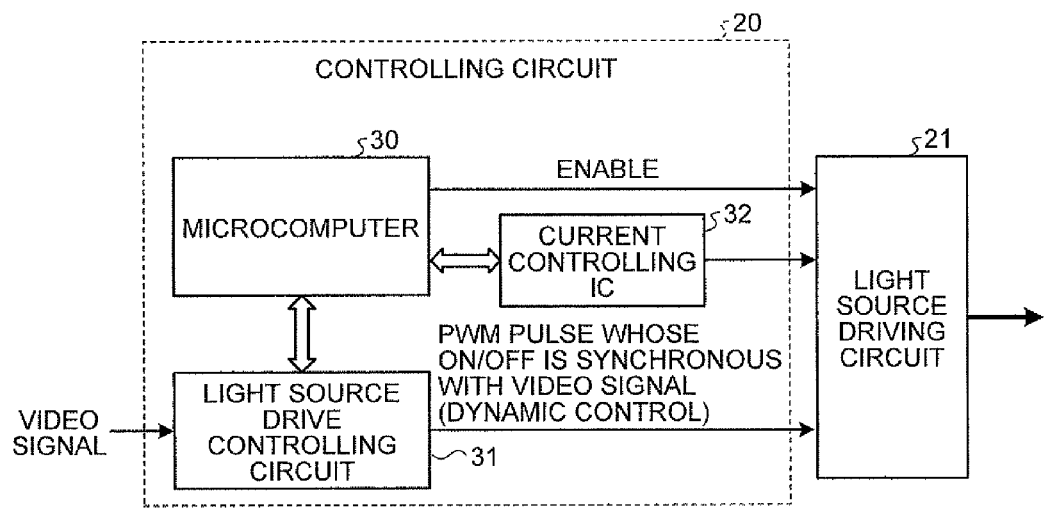
FIG. 5 is a diagram for showing the structure of a control circuit for driving the laser element.

Now, the structure of the circuit that performs signal processing for visual effects is explained with reference to FIG. 5. In FIG. 5, the structure of the controlling circuit 20 that drives the laser element 11 is illustrated. The controlling circuit 20 is provided with a microcomputer 30, as well as a light source drive controlling circuit 31 and a current controlling IC 32 that are both controlled by the microcomputer 30.

The equation for the relationship between the temperature of the laser element 11 and the high efficiency target temperature of the SHG element 15 that is obtained in advance by measurement may be stored, for example, in a storage medium (not shown) provided in the microcomputer 30.

The light source drive controlling circuit 31 generates a drive signal in synchronization with the input video signal and sends it to the light source driving circuit 21. For this reason, if no video signal is received, the drive signal is turned off to reduce the power consumption so that black can be further blackened in principle. Moreover, the PWM control is performed onto the light source drive signal in accordance with the signal level of the input signal so that the light source itself can also be dynamically controlled.

The current controlling IC 32 receives information of the signal level by way of the microcomputer 30. The structure in which dynamic control of the light source is enhanced and the power consumption is further reduced can be thereby realized. The light source drive controlling circuit 31 and the current controlling IC 32 are controlled by the microcomputer 30, and the light source drive controlling circuit 31 outputs a drive signal to which the control performed by the different controlling units is added.

Nowadays, the temperature of the laser element varies because variations in the drive current and ON/OFF of the drive enabling signal (changes in the duty cycle of the drive signal due to the PWM control) are controlled to perform signal processing for visual effects. According to the present embodiment, by controlling the temperature of the SHG element in accordance with variations in the temperature of the laser element, the wavelength conversion can be effectively achieved in the SHG element, and thus reduction in the power consumption can be expected.

Second Embodiment

Figure 4:
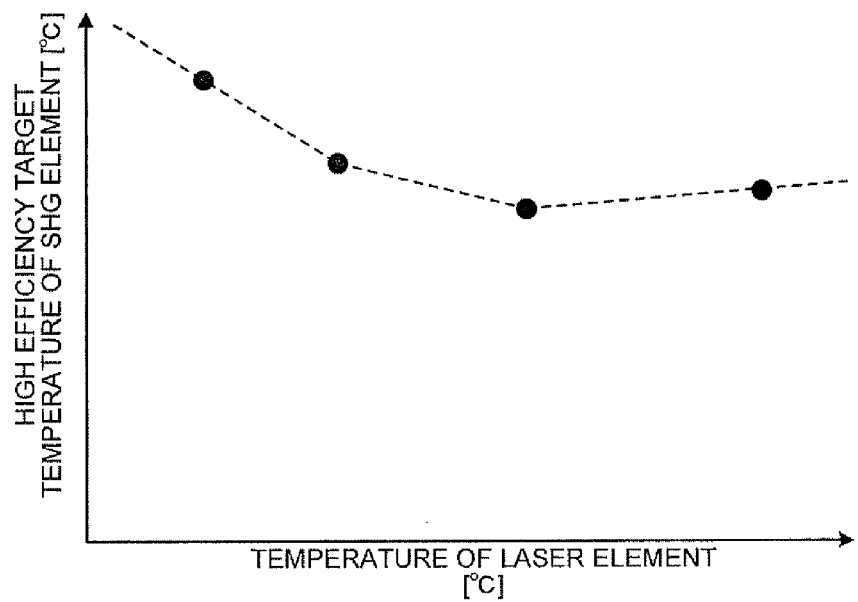
FIG. 4 is a diagram for showing still another relationship between the temperature of the laser element and the high efficiency target temperature of the SHG element.

With the aforementioned method of measuring the relationship between the temperature of the laser element 11 and the corresponding temperature at which the SHG element 15 delivers the largest optical power and obtaining the relational expression in the structure of the laser light source device 100 of FIG. 1, the optimum optical output can be further accurately realized by increasing the number of measurement points under possible conditions as indicated in FIG. 4.

According to the first embodiment, a linear equation connecting two points is found so that the optimum temperature, or in other words, the most efficient temperature of the SHG element 15 can be calculated by measuring the temperature of the laser element 11. Thus, by using the optimum temperature of the SHG element 15 as the target temperature of the SHG element 15, follow-up control is performed to bring the temperature of the SHG element 15 to the target temperature.

According to the present embodiment, the number of measurement conditions, or in other words the number of measurement points, is increased by changing the drive current amount or the like, and the measurement results are presented in graphical form to show the relationship between the temperatures of the laser element 11 and the SHG element 15. Then, as illustrated in FIG. 4, by connecting the points and finding the relational expression, the relationship between the temperatures of the laser element 11 and the SHG element can be further accurately obtained. In this manner, the target temperature for the further optimum and efficient operation of the SHG element 15 can be set.

Third Embodiment

The method of measuring the optimum relationship between the temperatures of the laser element and the SHG element under two conditions or more in which the drive current amount or the like is changed and obtaining a relational equation by interpolation and extrapolation between the measurement points in the structure of the laser light source device 100 illustrated in FIG. 1, as explained in the above embodiments, is not limited to linear interpolation and extrapolation as discussed above.

According to the present embodiment, the equation for the optimum relationship between the temperatures of the laser element 11 and the SHG element 15 is obtained by interpolation and extrapolation with an nth-order monomial equation or nth-order polynomial equation based on the measured data. In this manner, a relational equation into which the actual characteristics of the laser light source device 100 are incorporated can be obtained, and thus the target temperature of the SHG element 15 can be further accurately established.

Fourth Embodiment

Figure 6:
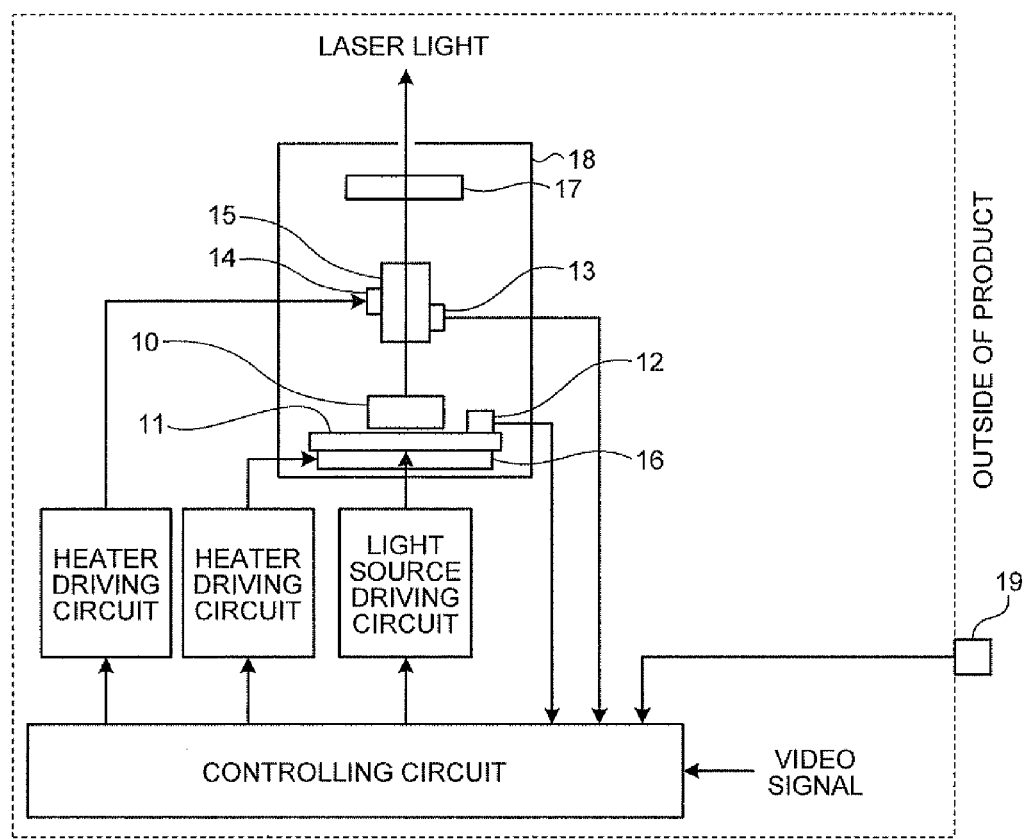
FIG. 6 is a diagram for showing the structure of a laser light source device incorporating an SHG element provided with an outside temperature sensor according to an embodiment of the present invention.

In the control performed by the structure of the laser light source device 100 of FIG. 1, the influence of ambient temperature of the laser element 11/SHG element 15, or outside temperature, may also be taken into consideration. In FIG. 6, the structure of a laser light source device 200 provided with an outside temperature (ambient temperature) sensor 19 according to the present embodiment is illustrated.

When the entire laser light source device 100 illustrated in FIG. 1 is considered as a product, the laser light source device 200 of FIG. 6 is provided with the outside temperature sensor 19 externally with respect to the product so that the outside temperature can be measured. Depending on the ambient temperature (outside temperature), the efficiency of the laser element 11 and the SHG element 15 may decline, and their lifespans may be shortened in relation to their power consumptions.

For this reason, if the outside temperature is higher than a predetermined temperature, the control for reducing the drive current amount (i.e., reducing the drive current to the laser element 11, or reducing the ratio of H if the PWM control is performed for the drive enabling signal (Enable) of the laser element 11) is used in combination so that reliability can be ensured. By incorporating the ambient temperature (outside temperature) into the control factors, whether variations in the temperature of the laser element 11 are attributed to variations in the drive current amount or an increase in the ambient temperature can be distinguished. Hence, the power consumption can be reduced in accordance with efficient wavelength conversion, and further accurate and reliable control can be realized.

In a laser light source device, when control is performed for the purpose of attaining efficient laser light output in accordance with variations in the drive current that drives the laser element and the ON/OFF controls of the drive signals (variations in the duty cycle of the drive signal subjected to the PWM control), the temperature of the SHG element changes, which changes the efficiency of the optical power. Then, if constant temperature maintaining control is adopted to keep the optimum target temperature, the optical power is lowered. In other words, the optimum temperature of the SHG element (i.e., the temperature at which optical power is the most efficiently converted) varies depending on the drive current, and the variations in the drive current is associated with the temperature of the laser element. According to the present embodiment, efficient temperature control is performed on both the laser element and the SHG element, and thereby the optical output can be attained at high efficiency.

The present invention should not be restricted by the above embodiments, and it can be modified in various manners without departing from the scope of the invention. For example, the combination of the laser element (excitation laser) 11 and the laser cell 10 described as the example may be replaced by a semiconductor laser. Furthermore, various levels of inventions are included in the above embodiments, and thus various inventions may be extracted by suitably combining the claimed structural components. For example, the embodiment from which some of the structural components are omitted can be extracted as an invention if the problems mentioned in the section of the Description of the Related Art can still be solved and the effects mentioned below can still be achieved. Moreover, the structural components of different embodiments may be suitably combined.

According to the present invention, the laser light source device achieves a highly efficient optical output by correcting a design value for an optimum target temperature of the harmonic generation element thereof in accordance with variations in a temperature of the laser element thereof.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A laser light source device, comprising:
   a laser element;
   a laser element temperature measuring unit that measures a temperature of the laser element;
   a harmonic generation element that converts a wavelength of laser light output by the laser element;
   a harmonic generation element temperature measuring unit that measures a temperature of the harmonic generation element;
   a harmonic generation element temperature adjusting unit that adjusts the temperature of the harmonic generation element;
   a storage unit that stores therein a relationship between the temperature of the laser element and a target temperature of the harmonic generation element at which power of the laser light output by the harmonic generation element reaches a maximum; and
   a controlling unit that controls the harmonic generation element temperature adjusting unit so that the temperature of the harmonic generation element is brought to the target temperature obtained in accordance with the relationship from the temperature of the laser element measured by the laser element temperature measuring unit.

2. The laser light source device according to claim 1, wherein the target temperature of the harmonic generation element at which the power of the laser light output by the harmonic generation element reaches the maximum is measured in correspondence with each of measurement points at which the laser element is set to different temperatures by driving the laser element with different drive currents, and the relationship is obtained by interpolation between the measurement points.

3. The laser light source device according to claim 1, wherein the target temperature of the harmonic generation element at which the power of the laser light output by the harmonic generation element reaches the maximum is measured in correspondence with each of measurement points at which the laser element is set to different temperatures by driving the laser element with drive enabling signals of PWM control that have different duty cycles, and the relationship is obtained by interpolation between the measurement points.

4. The laser light source device according to claim 2, further comprising an outside temperature sensor that measures an outside temperature, wherein:
   when the outside temperature measured by the outside temperature sensor is higher than a predetermined temperature, the laser element is driven by reducing the drive current.

5. The laser light source device according to claim 3, further comprising an outside temperature sensor that measures an outside temperature, wherein:
   when the outside temperature measured by the outside temperature sensor is higher than a predetermined temperature, the laser element is driven by reducing the duty cycle.

6. The laser light source device according to claim 2, wherein the interpolation is any one of a linear interpolation, an nth-order monomial interpolation, and an nth-order polynomial interpolation.

7. The laser light source device according to claim 3, wherein the interpolation is any one of a linear interpolation, an nth-order monomial interpolation, and an nth-order polynomial interpolation.

* * * * *